(12) United States Patent
Mitzlaff

(10) Patent No.: US 6,696,866 B2
(45) Date of Patent: Feb. 24, 2004

(54) METHOD AND APPARATUS FOR PROVIDING A SUPPLY VOLTAGE BASED ON AN ENVELOPE OF A RADIO FREQUENCY SIGNAL

(75) Inventor: James E. Mitzlaff, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/201,845

(22) Filed: Jul. 24, 2002

(65) Prior Publication Data

US 2004/0017251 A1 Jan. 29, 2004

(51) Int. Cl.[7] ................................................. H03D 1/00
(52) U.S. Cl. ............................ 327/50; 327/62; 330/308
(58) Field of Search ........................ 330/10, 136, 149, 330/253, 308; 327/560, 50, 58, 62, 63, 65

(56) References Cited

U.S. PATENT DOCUMENTS

| | | | |
|---|---|---|---|
| 5,239,275 A | 8/1993 | Leitch | 330/285 |
| 5,736,906 A | 4/1998 | Jacobson | 330/251 |
| 5,886,572 A * | 3/1999 | Myers et al. | 330/10 |
| 6,157,253 A * | 12/2000 | Sigmon et al. | 330/10 |
| 6,324,135 B1 * | 11/2001 | Kim et al. | 369/47.17 |

* cited by examiner

Primary Examiner—Dinh Le
(74) Attorney, Agent, or Firm—Steven A. May

(57) ABSTRACT

An envelope tracking amplification system that includes an envelope tracking power supply (ETPS) amplifies a radio frequency (RF) signal to produce a linearized amplified signal. The envelope tracking amplification system samples the RF signal to produce a sampled RF signal. The ETPS produces a control signal based on an instantaneous magnitude of the sampled RF signal and further based on an average magnitude of the sampled RF signal, produces multiple supply voltages, and, based on the control signal, couples a supply voltage of the multiple supply voltages to an output of the EPTS to produce an output supply voltage. The envelope tracking amplification system then amplifies the RF signal based on the output supply voltage to produce a highly linear amplified signal.

19 Claims, 3 Drawing Sheets

FIG. 1 —PRIOR ART—

METHOD AND APPARATUS FOR PROVIDING A SUPPLY VOLTAGE BASED ON AN ENVELOPE OF A RADIO FREQUENCY SIGNAL

FIELD OF THE INVENTION

The present invention relates generally to wireless communication devices and in particular to a wideband envelope tracking amplification system of a wireless communication device.

BACKGROUND OF THE INVENTION

Power amplifiers for wireless transmission applications, such as radio frequency (RF) power amplifiers, are utilized in a wide variety of communications and other electronic applications. Ideally, the input-output transfer function of a power amplifier should be linear, that is, should implement a constant gain adjustment and phase adjustment of an input signal, wherein a perfect replica of the input signal, increased in amplitude, appears at the output of the power amplifier.

In addition, for greater efficiency, various RF systems, such as cellular systems, attempt to run power amplifiers at or near their saturation levels, in which the actual output power of the amplifier is just below its maximum rated power output level. This power output level is generally related to the supply voltage (or supply power) to the power amplifier, such that a greater supply voltage will produce a correspondingly greater output power from the amplifier; for higher power input signals, a correspondingly greater actual power output is required to maintain the amplifier at or near saturation. In various prior art amplifiers, however, the supply voltage to the power amplifier is fixed. Given a typical usage situation in which actual power output from the amplifier may vary by a range of several orders of magnitude, use of a fixed supply voltage is highly inefficient, as output power is often an order of magnitude or more below its maximum, and the power amplifier is not maintained at or near its saturation levels.

Various techniques have evolved to vary the supply voltage to maintain the power amplifier at or near saturation. One such technique is power supply modulation (PSM) that varies, or modulates, the supply voltage to the power amplifier in order to maintain the power amplifier at or near saturation while the input signal varies over time. For PSM, the supply voltage of the amplifier tracks the input signal variations, typically utilizing a signal detector in conjunction with a tracking power supply. In the prior art, however, the various PSM techniques have generally been limited to narrowband applications, or have poor efficiency characteristics.

For example, one prior art PSM technique, known as "envelope elimination and restoration" (EER), utilizes a limiter to provide an essentially constant drive level to the power amplifier to maintain the amplifier in a hard saturation state and increase efficiency. Use of the limiter, however, greatly expands the bandwidth of the RF signal input to the amplifier and requires very accurate tracking of the input signal envelope, with a power supply switching frequency approximately ten times greater than the bandwidth of the RF input signal. As these switching frequencies increase, the transistors within the tracking power supply become less efficient, resulting in excessive power losses. The resulting bandwidth expansion of the limiter also requires the bandwidth capability of the amplifier to be significantly greater than the input signal bandwidth, limiting the EER configuration to narrow bandwidth applications, such as amplitude modulation (AM) RF broadcasts.

Another prior art PSM technique, known as "envelope tracking," does not utilize the limiter of EER. Consequently, envelope tracking power amplification systems may be more suitable for higher bandwidth applications. FIG. 1 is a block diagram of an exemplary envelope tracking power amplification system 100. A radio frequency (RF) signal 101 is coupled to an input 102 of amplification system 100. A signal coupler 104 samples input signal 101 to produce a sampled input signal 105 and routes sampled input signal 105 to an envelope tracking power supply (ETPS) 106. ETPS 106 tracks or detects an envelope of sampled input signal 105 to produce an envelope detector signal, typically a voltage, and produces a variable supply voltage 107 based on the detected envelope of input signal 101. ETPS typically includes a switching power supply whose switching pulse width or frequency is varied in order to track the envelope of input signal 101 and produce variable supply voltage 107.

ETPS 106 sources variable supply voltage 107 to an RF power amplifier 108. Variable supply voltage 107 is designed to maintain RF power amplifier 108 at or near saturation and to increase the efficiency of power amplification system 100 over a wide range of variation in input signal 101. When input signal 101 is a wideband RF signal, the switching power supply of ETPS 106 must have a very rapid response in order to track RF input signal 101. However, if variable supply voltage 107 is to accurately reproduce the envelope of RF input signal 101, then the switching frequency of ETPS 106 should be 5–10 times the bandwidth of input signal 101. For example, if input signal 101 has a bandwidth of 20 MHz, as is common in multi-carrier amplification systems, then ETPS 106 should have a prohibitively high switching frequency of 100–200 MHz.

In order to resolve the requirement for a prohibitively high switching frequency power supply, schemes have been proposed for utilizing multiple voltage supplies in implementing the ETPS, such as in U.S. Pat. No. 5,239,275, entitled "Amplitude Modulator Circuit Having Multiple Power Supplies," and U.S. Pat. No. 5,736,906, entitled "Power Supply Modulator Circuit for Transmitter." Such schemes typically involve selecting a voltage supply of the multiple voltage supplies, or serially connecting one or more voltage supplies of the multiple voltage supplies, based on a detected instantaneous magnitude, or amplitude, of the input signal. However, multi-carrier input signals typically have a wide dynamic range, often in the range of 10–20 dB, due to high short-term peak-to-average power ratios caused by the multiple carriers and due to long term fluctuations in average power due to variations in traffic loading. In order to track a multi-carrier input signal, the ETPS may require a subdivision of an input signal voltage range into as many as 10 to 12 input signal amplitude steps and correspondingly may require as many as 10–12 voltage supplies. The use of such a large number of voltage supplies is both prohibitively expensive and complex.

Therefore, there is a need for a high efficiency, low cost method and apparatus for tracking a wideband RF signal under high dynamic range conditions.

BRIEF DESCRIPTION OF THE DRAWINGS

FIG. 1 is a block diagram of an envelope tracking amplification system of the prior art.

DETAILED DESCRIPTION OF THE INVENTION

Figure 2:
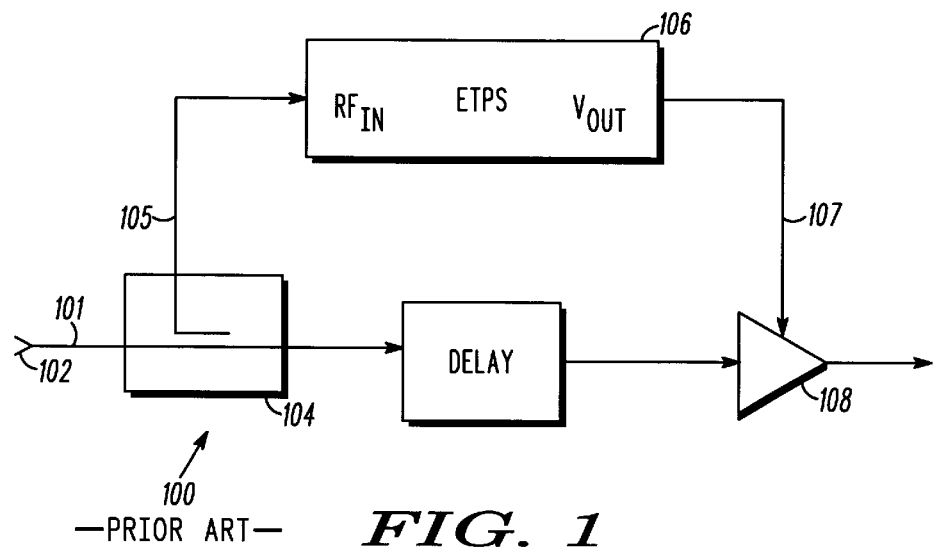
FIG. 2 is a block diagram of an envelope tracking amplification system in accordance with an embodiment of the present invention.

To address the need for a high efficiency, low cost method and apparatus for tracking a wideband RF signal under high dynamic range conditions, an envelope tracking amplification system that includes an envelope tracking power supply (ETPS) amplifies a radio frequency (RF) signal to produce a linearized amplified signal. The envelope tracking amplification system samples the RF signal to produce a sampled RF signal. The ETPS produces a control signal based on an instantaneous magnitude of the sampled RF signal and further based on an average magnitude of the sampled RF signal, produces multiple supply voltages, and, based on the control signal, couples a supply voltage of the multiple supply voltages to an output of the EPTS to produce an output supply voltage. The envelope tracking amplification system then amplifies the RF signal based on the output supply voltage to produce a highly linear amplified signal.

Generally, one embodiment of the present invention encompasses an apparatus for controlling a supply voltage output by an envelope tracking power supply. The apparatus includes a first detector that detects a magnitude of a radio frequency (RF) signal and produces a first detector signal corresponding to an average magnitude of the RF signal and a second detector that detects a magnitude of the RF signal and produces a second detector signal corresponding to an instantaneous magnitude of the RF signal. The apparatus further includes a ratioing unit coupled to each of the first detector and the second detector that compares the first detector signal to the second detector signal to produce a comparison and produces a control signal based on the comparison, wherein the control signal is capable of controlling a supply voltage output by the envelope tracking power supply.

Another embodiment of the present invention encompasses a method for controlling a supply voltage output by an envelope tracking power supply. The method includes steps of detecting a first magnitude of an RF signal to produce a first detected magnitude and, based on the first detected magnitude, producing a first detector signal corresponding to an average magnitude of the RF signal. The method further includes steps of detecting a second magnitude of the RF signal to produce a second detected magnitude and, based on the second detected magnitude, producing a second detector signal corresponding to an instantaneous magnitude of the RF signal. The method further includes steps of comparing the first detector signal to the second detector signal to produce a comparison and producing a control signal based on the comparison, wherein the control signal is capable of controlling a supply voltage that is output by the envelope tracking power supply.

Yet another embodiment of the present invention encompasses an envelope tracking amplification system for amplifying an RF signal. The envelope tracking amplification system includes a signal coupler that samples the RF signal to produce a sampled RF signal and an envelope tracking power supply operably coupled to the signal coupler and having an input and an output, wherein the envelope tracking power supply receives the sampled RF signal at the input, produces a control signal based on an instantaneous magnitude of the sampled RF signal and further based on an average magnitude of the sampled RF signal, produces a plurality of supply voltages, and, based on the control signal, couples a supply voltage of the plurality of supply voltages to the output to produce an output supply voltage. The envelope tracking amplification system further includes an RF power amplifier operably coupled to the envelope tracking power supply that receives the output supply voltage and amplifies the RF signal based on the output supply voltage to produce an amplified signal.

The present invention may be more fully described with reference to FIGS. 2–4. FIG. 2 is a block diagram of envelope tracking amplification system 200 in accordance with an embodiment of the present invention. Envelope tracking power amplification system 200 includes an input 202 operably coupled to a signal coupler 204, preferably a directional coupler, and further operably coupled to an RF power amplifier 212 via signal coupler 204 and a delay circuit 214. Envelope tracking power amplification system 200 further includes an envelope tracking power supply (ETPS) 208 that is operably coupled at an input 206 to signal coupler 204 and at an output 210 to RF power amplifier 212. Delay circuit 214 is utilized to delay, and thereby synchronize, a version of input signal 201 that is applied to RF power amplifier 212 with a corresponding variable supply voltage 211 that is sourced by ETPS 208 to the RF power amplifier. RF power amplifier 212 includes an RF amplifying element, an input matching circuit, an output matching circuit, and biasing and decoupling circuitry as are necessary to allow the functionality of the RF amplifying element and to bias the RF amplifying element class AB; however, those of ordinary skill in the art realize that other biases, such as classes A, B, or C, may be used here without departing from the spirit and scope of the present invention.

When an RF signal 201 is coupled to input 202 of amplification system 200, the amplification system routes the RF signal to signal coupler 204. Signal coupler 204 samples input signal 201 to produce a sampled input signal 205 and routes the sampled input signal to ETPS 208 via ETPS input 206. ETPS 208 detects, or tracks, the envelope of input signal 201 and produces a variable supply voltage 211 based on the envelope of input signal 201. ETPS 208 then sources variable supply voltage 211 to RF power amplifier 212 via ETPS output 210. RF power amplifier 212 amplifies a delayed version of input signal 201 based on variable supply voltage 211 to produce an amplified signal 213 that is output by amplification system 200. By detecting, or tracking, the envelope of input signal 201, ETPS 208 provides a variable supply voltage 211 to RF power amplifier 212 that enables the RF power amplifier to be maintained at or near saturation over a wide range of magnitudes of input signal 201, thereby providing for highly efficient amplification of the input signal.

Figure 3:
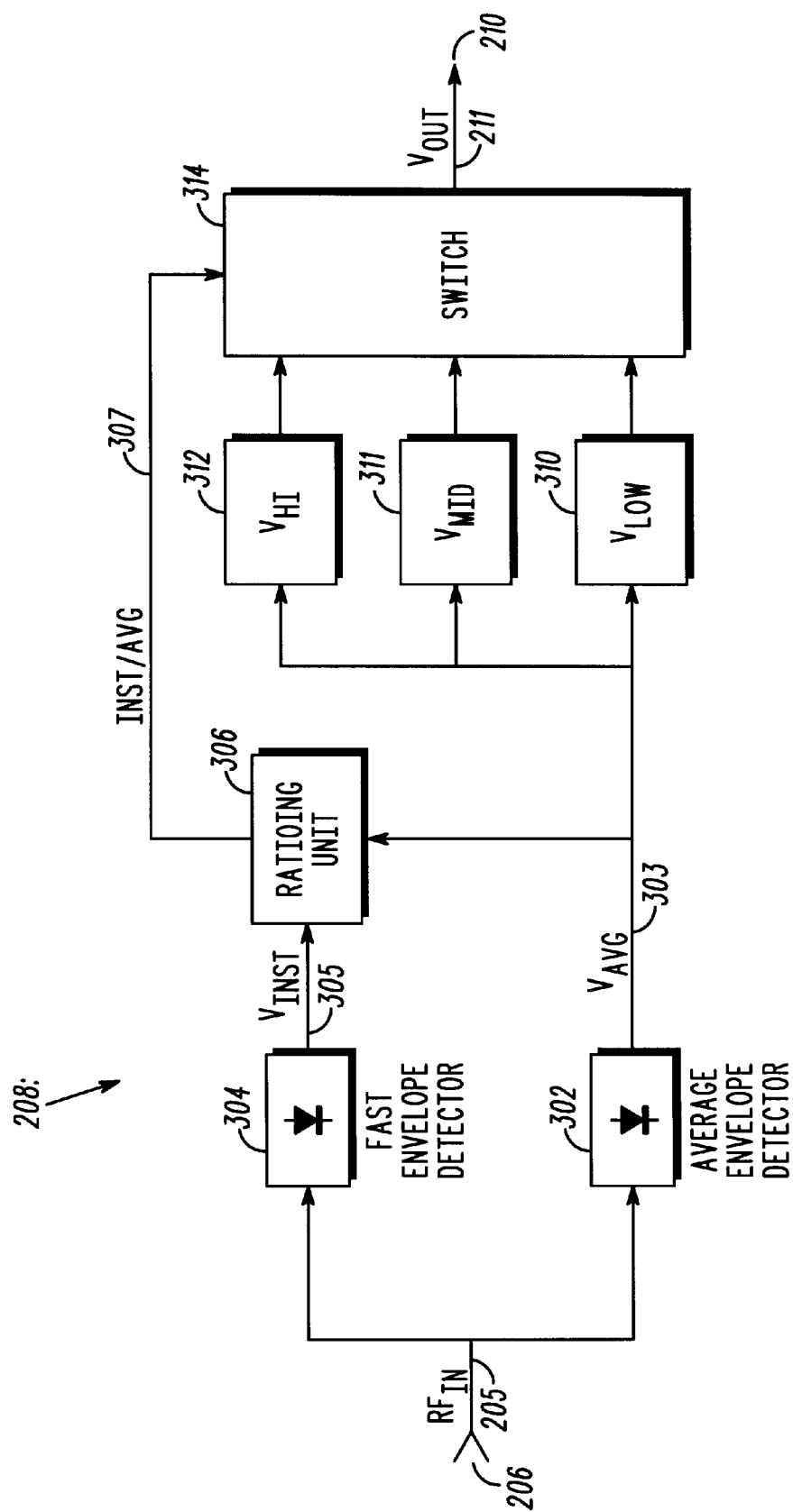
FIG. 3 is a block diagram of the envelope tracking power supply of FIG. 2 in accordance with an embodiment of the present invention.

FIG. 3 is a block diagram of ETPS 208 in accordance with an embodiment of the present invention. ETPS 208 includes an average envelope detector 302, a fast envelope detector 304, and a ratioing unit 306 operably coupled to each of the average envelope detector and the fast envelope detector. ETPS 208 further includes multiple tracking power supplies 310–312 (three shown) that are each operably coupled to the average envelope detector 302 and a switching device 314 operably coupled to ratioing unit 306, to each power supply of the multiple tracking power supplies 310–312, and to output 210 of ETPS 208. In order to accurately reproduce the envelope of RF input signal 201 when the signal is a wideband signal with a wide dynamic range, ETPS 208 produces a variable supply voltage 211 that is based on both an instantaneous magnitude and an average magnitude of input signal 201. By utilizing both the instantaneous magnitude and the average magnitude of input signal 201 in producing variable supply voltage 211, ETPS 208 is able to accurately reproduce the envelope of RF input signal 201 under wide dynamic range conditions at a lower cost and complexity than the prior art.

Figure 4:
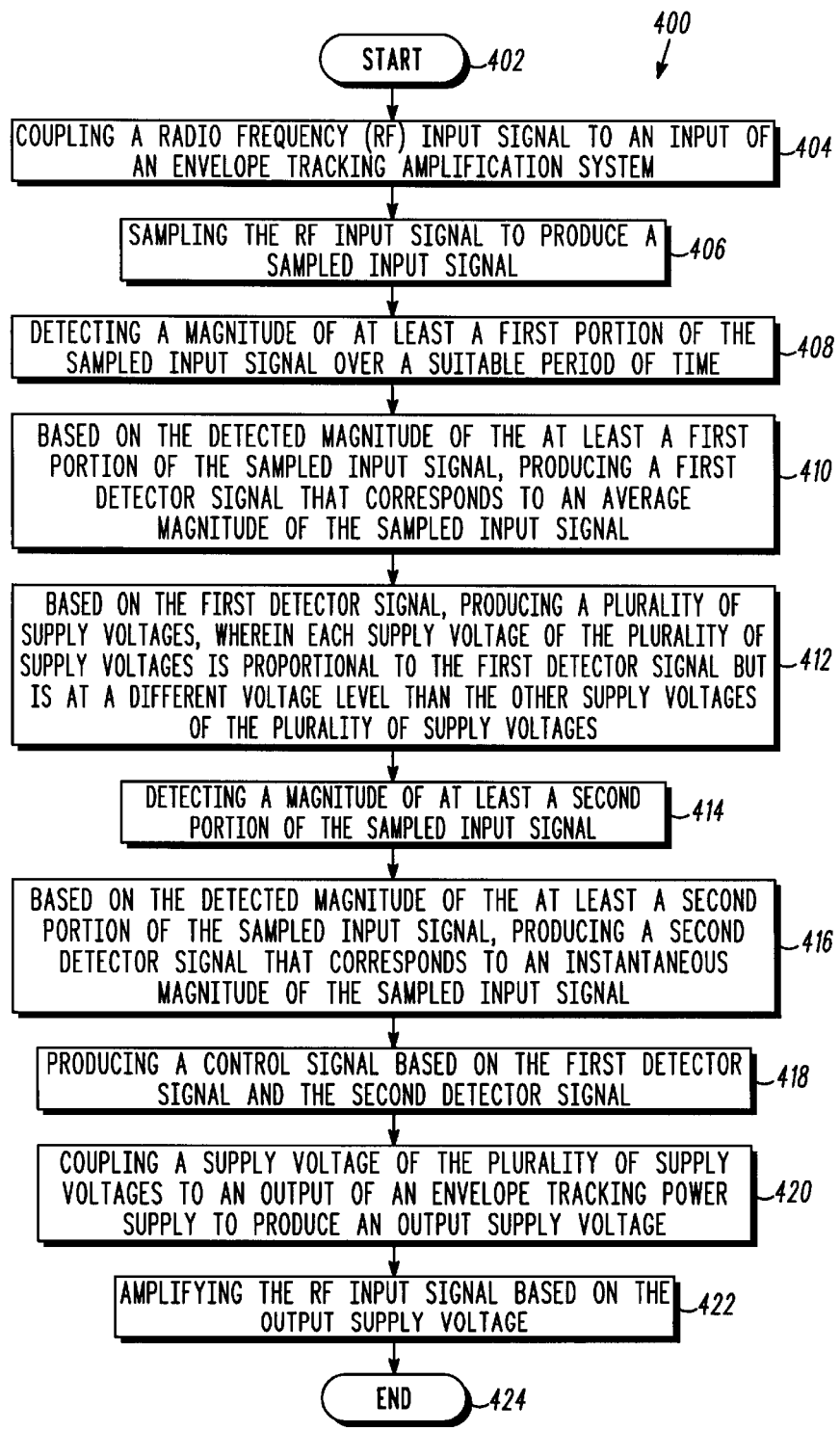
FIG. 4 is a logic flow diagram of steps executed by the envelope tracking amplification system of FIG. 2 in amplifying a radio frequency signal in accordance with an embodiment of the present invention.

FIG. 4 is a logic flow diagram 400 of steps executed by envelope tracking amplification system 200 in amplifying RF input signal 201 in accordance with an embodiment of the present invention. Logic flow diagram 400 begins (402) when RF signal 201 is coupled (404) to input 202 of system 200. Envelope tracking amplification system 200 routes input signal 201 to signal coupler 204. Signal coupler 204 samples (406) input signal 201 to produce sampled input signal 205. Signal coupler 204 then routes sampled input signal 205 to ETPS 208.

ETPS 208 routes at least a first portion of sampled input signal 205 to average envelope detector 302 and at least a second portion of sampled input signal 205 to fast envelope detector 304. The at least a first portion and the at least a second portion of sampled input signal 205 may be identical signals. Average envelope detector 302 detects (408), or tracks, a magnitude of the at least a first portion of the sampled input signal over a suitable period of time, such a 10 microseconds ($\mu$s). Based on the detected magnitude, average envelope detector 302 produces (410) a first envelope detector signal 303, typically a voltage ($V_{AVG}$), that corresponds to the magnitude of the at least a first portion of sampled input signal 205 averaged over the period of time. Average envelope detector 302 then conveys first envelope detector signal 303 to ratioing unit 306 and to each of the multiple tracking power supplies 310–312.

In one embodiment of the present invention, average envelope detector 302 may comprise a first diode detector that is coupled at its output to a first low pass filter. Preferably the low pass filter has a cutoff that is well below the frequency of RF input signal 201, such as a cutoff that filters out all signals above the audio band. In another embodiment of the present invention, average envelope detector 302 may comprise the fast envelope detector 305 described below followed by yet another low pass filter with a suitable cutoff band. Those who are of ordinary skill in the art realize that there are many techniques for implementing an average envelope detector that produces a signal that corresponds to an average, over some suitable period of time, of a magnitude of a signal coupled to the detector, and that any such technique may be used herein without departing from the spirit and scope of the present invention.

Based on first envelope detector signal 303, each tracking power supply of the multiple tracking power supplies 310–312 produces (412) a variable supply voltage that is proportional to the first envelope detector signal but is at a different voltage level than the variable supply voltages produced by the other power supplies of the multiple tracking power supplies 310–312. For example, power supply 310 may be a low voltage ($V_{LOW}$) power supply. Power supply 311 may then be a mid-range voltage ($V_{MID}$) power supply, such as a power supply with a maximum output voltage that is two times the maximum output voltage of power supply 310, and power supply 312 may be a high voltage ($V_{HI}$) power supply with a maximum output voltage that is four times the maximum output voltage of power supply 310. Preferably, the scaling between first envelope detector signal 303 and the output voltages of each of the multiple power supplies 310–312 is such that the maximum output voltage of the top voltage range ($V_{HI}$) power supply, that is, power supply 312, is attained when first envelope detector signal 303 attains a magnitude corresponding to the maximum average RF power rating of envelope tracking amplification system 200. For example, if the RF amplifying element of RF power amplifier 212 is a lateral drain metal oxide semiconductor (LDMOS) with a voltage rating of 26 volts (V), then the maximum output voltage of power supply 312 may be 26 V and the maximum output voltages of power supplies 311 and 310 may be 13 V and 6.5 V, respectively.

Fast envelope detector 304 detects (414), or tracks, a magnitude of the at least a second portion of sampled input signal 205 and, based on the detected magnitude, produces (416) a second envelope detector signal 305, typically a voltage ($V_{INST}$), that corresponds to an instantaneous magnitude of the at least a second portion of sampled input signal 205. Fast envelope detector 304 then conveys second envelope detector signal 305 to ratioing unit 306.

In one embodiment of the present invention, fast envelope detector 304 may comprise a second diode detector that is coupled at its output to a second low pass filter. Preferably the second low pass filter cuts off at a higher frequency than the cutoff of the first low pass filter but that is also well below the frequency of RF input signal 201, such as a low pass filter with a passband that is approximately as wide as the bandwidth of the envelope of RF input signal 201. Those who are of ordinary skill in the art realize that there are many techniques for implementing a fast envelope detector that produces a signal that corresponds to an instantaneous magnitude of a signal coupled to the detector, and that any such technique may be used herein without departing from the spirit and scope of the present invention.

Preferably, ratioing unit 306 is implemented in a processor, such as a microprocessor, a digital signal processor (DSP), or a microcontroller, and further includes multiple analog-to-digital converters (AID's) that digitize each of signals 303 and 305 to produce digital signals that are processed by the processor. Ratioing unit 306 may further include a digital-to-analog converter (D/A) that produces an analog control signal 307 when switching device 314 is an analog signal-controlled device. Ratioing unit 306 receives first envelope detector signal 303 from average envelope detector 302 and further receives second envelope detector signal 305 from fast envelope detector 304. Ratioing unit 306 produces (418) a control signal 307 based on first envelope detector signal 303 and second envelope detector signal 305 and conveys the control signal to switching device 314. Based on control signal 307, switching device 314 then couples (420) a tracking power supply of the multiple tracking power supplies 310–312 to output 210 of ETPS 208, thereby coupling the supply voltage produced by the coupled tracking power supply to output 210 to produce ETPS output supply voltage 211.

Envelope tracking amplification system 200 routes ETPS output supply voltage 211 to RF power amplifier 212. In addition to receiving output supply voltage 211, RF power amplifier 212 receives a delayed version of input signal 201 from signal coupler 204 via delay circuit 214. RF power amplifier 212 amplifies (422) the delayed input signal 201 based on output supply voltage 211 to produce amplified signal 213, and the logic flow ends (424).

Preferably, the step of producing control signal 307 includes steps of comparing first envelope detector signal 303 to second envelope detector signal 305 to produce a comparison and producing the control signal based on the comparison. Preferably, the step of comparing first envelope detector signal 303 to second envelope detector signal 305 comprises a step of determining a ratio of second envelope detector signal 305 to first envelope detector signal 303 (herein referred to as the "INST/AVG" ratio). Ratioing unit 306 then produces control signal 307 based on the determined ratio. However, those of ordinary skill in the art realize that other methods of comparing first envelope detector signal 303 to second envelope detector signal 305 may be used herein without departing from the spirit and scope of the present invention. For example, ratioing unit 306 may determine a ratio of first envelope detector signal 303 to second envelope detector signal 305 (an AVG/INST ratio) or may determine a difference between second envelope detector signal 305 and first envelope detector signal 303.

In one embodiment of the present invention, switching device 314 comprises a multiplexer that includes an output coupled to output 210 of ETPS 208 and multiple inputs that are each coupled to a tracking power supply of the multiple tracking power supplies 310–312. Control signal 307 may then be a voltage whose magnitude is varied based on the comparison determined by ratioing circuit 306 of first detector signal 303 to second detector signal 305, such as a voltage that is proportional to the INST/AVG ratio. Based on the magnitude of control signal 307, switching device 314 couples an input of the multiple multiplexer inputs to the multiplexer output, thereby coupling a corresponding tracking power supply to output 210 of ETPS 208. Preferably, the coupled power supply is capable of sourcing a voltage in a voltage range that is sufficient to keep the RF amplifying element of RF power amplifier 212 at or near saturation without causing clipping when the RF amplifying element amplifies the corresponding input signal 201.

In another embodiment of the present invention, switching device 314 may comprise multiple switching devices, such as PIN diodes or GASFET switches, that are each closed or opened, or enabled or disabled, by a control signal received from ratioing unit 306. Each switching device of the multiple switching devices is coupled at an output to a signal combiner and at an input to a tracking power supply of the multiple tracking power supplies 310–312. In addition, each switching device is individually coupled, for example by a set of logic lines, to ratioing unit 306. Control signal 307 may then comprise one or more control signals, wherein each control signal of the one or more control signals is used by ratioing unit 306 to close or open a corresponding switching device, thereby respectively coupling a corresponding tracking power supply to or decoupling a corresponding tracking power supply from output 210 of ETPS 208. In such an embodiment, the step of producing (416) a control signal 307 may include the following steps. Ratioing unit 306 compares the ratio or difference determined with respect to the first and second envelope detector signals 303, 305 to at least one threshold, which the at least one threshold is stored in a memory associated with the processor implementing the ratioing unit. Ratioing unit 306 utilizes the at least one threshold to determine which tracking power supply of the multiple tracking power supplies 310–312 to couple to output 210 of ETPS 208. Based on the comparison of the determined ratio or difference to the threshold, ratioing unit 206 produces a control signal 307 which causes an appropriate power supply of the multiple power supplies 310–312 to be coupled to output 210.

For example, and merely for the purpose of illustrating the principles of the present invention, ratioing unit 306 may cause switching device 314 to couple power supply 310 to output 210 when an INST/AVG ratio determined by the ratioing unit is less than one (1). When the INST/AVG ratio is between one (1) and two (2) (i.e., a ratio of 0 to 6 dB), ratioing unit 306 may cause switching device 314 to couple power supply 311 to output 210, and when the INST/AVG ratio greater than two (2), ratioing unit 306 may cause switching device 314 to couple power supply 312 to output 210. Such a scheme would prevent RF power amplifier 212 from clipping a signal amplified by the amplifier for INST/AVG ratios of up to 4 (i.e., a ratio of 12 dB).

In sum, an envelope tracking amplification system 200 is provided that includes an envelope tracking power supply (ETPS) 208 and that amplifies an RF signal 201 coupled to the system to produce a linearized amplified signal. A signal coupler 204 included in the envelope tracking amplification system samples the RF signal to produce a sampled RF signal 205. ETPS 208 produces a control signal 307 based on an instantaneous magnitude of the sampled RF signal and further based on an average magnitude of the sampled RF signal. ETPS 208 further produces multiple supply voltages, and, based on the control signal, couples a supply voltage of the multiple supply voltages to an output 210 of the EPTS to produce an output supply voltage 211. Envelope tracking amplification system 200 then amplifies RF signal 201 based on output supply voltage 211 to produce a highly linear amplified signal 213. By producing a control signal that controls ETPS output supply voltage 211 based on both an instantaneous magnitude and an average magnitude of the sampled RF signal, while producing multiple supply voltages based on the average magnitude of the sampled RF signal, envelope tracking amplification system 200 is able to accurately reproduce the envelope of a wideband RF signal under wide dynamic range conditions in a highly efficient and low cost manner.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus for controlling a supply voltage output by an envelope tracking power supply comprising:
   a first detector that detects a magnitude of a radio frequency (RF) signal and produces a first detector signal corresponding to an average magnitude of the RF signal;
   a second detector that detects a magnitude of the RF signal and produces a second detector signal corresponding to an instantaneous magnitude of the RF signal; and a ratioing unit coupled to each of the first detector and the second detector that compares the first detector signal to the second detector signal to produce a comparison and produces a control signal based on the comparison, wherein the control signal controls the supply voltage output by the envelope tracking power supply.

2. The apparatus of claim 1, wherein the ratioing unit compares the first detector signal to the second detector signal by determining a ratio between the first detector signal and the second detector signal.

3. The apparatus of claim 1, wherein the ratioing unit compares the first detector signal to the second detector signal by determining a difference between the first detector signal and the second detector signal.

4. The apparatus of claim 1, further comprising:
a plurality of power supplies, wherein each power supply of the plurality of power produces a supply voltage; and
a switching device coupled to the ratioing unit and to each power supply of the plurality of power supplies, wherein the switching device couples at least one power supply of the plurality of power supplies to an output of the envelope tracking power supply based on the control signal.

5. The apparatus of claim 4, wherein each power supply of the plurality of power supplies is coupled to the first detector and wherein the supply voltage produced by each power supply of the plurality of power supplies is based on the first detector signal.

6. The apparatus of claim 4, wherein the switching device comprises a plurality of switching device inputs and a switching device output, wherein each input of the plurality of switching device inputs is coupled to a power supply of the plurality of power supplies, and wherein, in response to receiving the control signal, the switching device couples an input of the plurality of switching device inputs to the switching device output.

7. The apparatus of claim 4, wherein the supply voltage produced by each power supply of the plurality of power supplies is proportional to the first detector signal but is at a different level than the supply voltages produced by the other power supplies of the plurality of power supplies.

8. The apparatus of claim 4, wherein each power supply of the plurality of power supplies is capable of producing a voltage in a voltage range that is different from voltage ranges associated with each of the other power supplies of the plurality of power supplies and wherein a maximum output voltage of a top voltage range power supply of the plurality of power supplies is attained when the first detector signal attains a magnitude corresponding to a radio frequency average power rating of an envelope tracking amplification system.

9. A method for controlling a supply voltage output by an envelope tracking power supply comprising steps of:
detecting a first magnitude of a radio frequency (RF) signal to produce a first detected magnitude;
based on the first detected magnitude, producing a first detector signal corresponding to an average magnitude of the RF signal;
detecting a second magnitude of the RF signal to produce a second detected magnitude;
based on the second detected magnitude, producing a second detector signal corresponding to an instantaneous magnitude of the RF signal; and
comparing the first detector signal to the second detector signal to produce a comparison; and
producing a control signal based on the comparison, wherein the control signal controls the supply voltage that is output by the envelope tracking power supply.

10. The method of claim 9, wherein the step of comparing the first detector signal to the second detector signal comprises a step of determining a ratio between the first detector signal and the second detector signal.

11. The method of claim 9, wherein the step of comparing the first detector signal to the second detector signal comprises a step of determining a difference between the first detector signal and the second detector signal.

12. The method of claim 9, further comprising steps of:
producing a plurality of supply voltages; and
coupling a supply voltage of the plurality of supply voltages to an output of the envelope tracking power supply based on the control signal.

13. The method of claim 12, wherein each supply voltage of the plurality of supply voltages is based on the first detector signal.

14. The method of claim 12, wherein each supply voltage of the plurality of supply voltages is proportional to the first detector signal but is at a different level than the other supply voltages of the plurality of supply voltages.

15. The method of claim 12, wherein each supply voltage of the plurality of supply voltages occurs within a predetermined voltage range, resulting in a plurality of voltage ranges and wherein a maximum supply voltage of a top voltage range of the plurality of voltage ranges is attained when the first detector signal attains a magnitude corresponding to a radio frequency average power rating of an envelope tracking amplification system.

16. An envelope tracking amplification system for amplifying a radio frequency (RF) signal, the envelope tracking amplification system comprising:
a signal coupler that samples the RF signal to produce a sampled RF signal;
an envelope tracking power supply operably coupled to the signal coupler that comprises:
a first detector that detects a magnitude of the sampled RF signal and produces a first detector signal corresponding to an average magnitude of the RF signal;
a second detector that detects a magnitude of the sampled RF signal and produces a second detector signal corresponding to an instantaneous magnitude of the RF signal;
a ratioing unit coupled to each of the first detector and the second detector that produces a control signal based on the first detector signal and the second detector signal, wherein the envelope tracking power supply produces an output supply voltage based on the control signal; and
an RF power amplifier operably coupled to the envelope tracking power supply that receives the output supply voltage and amplifies the RF signal based on the output supply voltage to produce an amplified signal.

17. The envelope tracking amplification system of claim 16, wherein the envelope tracking power supply produces a plurality of supply voltages and, based on the control signal, couples a supply voltage of the plurality of supply voltages to an output of the envelope tracking power supply to produce the output supply voltage.

18. The envelope tracking amplification system of claim 17, wherein the envelope tracking power supply further comprises:
a plurality of power supplies, wherein each power supply of the plurality of power supplies produces a supply voltage of the plurality of supply voltages; and
a switching device coupled to the ratioing unit and to each power supply of the plurality of power supplies, wherein the switching device couples a power supply of the plurality of power supplies to the output of the envelope tracking power supply based on the control signal.

19. The envelope tracking amplification system of claim 18, wherein each power supply of the plurality of power supplies is coupled to the first detector and wherein the supply voltage produced by each power supply of the plurality of power supplies is based on the first detector signal.

* * * * *